United States Patent
Dong et al.

(10) Patent No.: US 8,036,044 B2
(45) Date of Patent: Oct. 11, 2011

(54) DYNAMICALLY ADJUSTABLE ERASE AND PROGRAM LEVELS FOR NON-VOLATILE MEMORY

(75) Inventors: Yingda Dong, San Jose, CA (US); Jun Wan, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 81 days.

(21) Appl. No.: 12/504,576

(22) Filed: Jul. 16, 2009

(65) Prior Publication Data

US 2011/0013460 A1    Jan. 20, 2011

(51) Int. Cl.
*G11C 11/34* (2006.01)
*G11C 16/04* (2006.01)

(52) U.S. Cl. ......... 365/185.29; 365/185.18; 365/185.19; 365/185.22

(58) Field of Classification Search ............. 365/185.22, 365/185.18, 185.19, 185.29
See application file for complete search history.

(56) References Cited

U.S. PATENT DOCUMENTS

| | | | |
|---|---|---|---|
| 5,270,979 A | 12/1993 | Harari | |
| 5,537,358 A | 7/1996 | Fong | |
| 5,696,717 A | 12/1997 | Koh | |
| 5,909,390 A | 6/1999 | Harari | |
| 6,026,023 A | 2/2000 | Tonda | |
| 6,330,189 B1 * | 12/2001 | Sakui et al. | 365/185.22 |
| 6,418,058 B1 * | 7/2002 | Sakui et al. | 365/185.22 |
| 6,449,190 B1 | 9/2002 | Bill | |
| 6,519,184 B2 | 2/2003 | Tanaka | |
| 6,657,897 B2 | 12/2003 | Watanabe | |
| 6,711,066 B2 | 3/2004 | Tanzawa | |
| 6,839,281 B2 | 1/2005 | Chen | |
| 7,200,708 B1 | 4/2007 | Kreifels | |
| 7,532,520 B2 * | 5/2009 | Yanagidaira et al. | 365/185.29 |
| 2006/0028875 A1 | 2/2006 | Avraham | |
| 2006/0158940 A1 | 7/2006 | Shappir et al. | |
| 2008/0019182 A1 | 1/2008 | Yanagidaira et al. | |
| 2008/0117688 A1 | 5/2008 | Park | |
| 2008/0266970 A1 | 10/2008 | Lee | |
| 2009/0067257 A1 | 3/2009 | Lee | |
| 2009/0168510 A1 | 7/2009 | Lee et al. | |

OTHER PUBLICATIONS

U.S. Appl. No. 12/332,646, filed Dec. 11, 2008.
International Search Report mailed Sep. 6, 2010, International Appln. No. PCT/US2010/037845 filed Jun. 8, 2010.

* cited by examiner

*Primary Examiner* — Hoai V Ho
*Assistant Examiner* — Kretelia Graham
(74) *Attorney, Agent, or Firm* — Vierra Magen Marcus & DeNiro LLP

(57) ABSTRACT

Degradation of non-volatile storage elements is reduced by adaptively adjusting erase-verify levels and program-verify levels. The number of erase pulses, or the highest erase pulse amplitude, needed to complete an erase operation is determined. When the number, or amplitude, reaches a limit, the erase-verify level is increased. As the erase-verify level is increased, the number of required erase pulses decreases since the erase operation can be completed more easily. An accelerating increase in the degradation is thus avoided. One or more program-verify levels can also be increased in concert with changes in the erase-verify level. The one or more program-verify levels can increase by the same increment as the erase-verify level to maintain a constant threshold voltage window between the erased state and a programmed state, or by a different increment. Implementations with binary or multi-level storage elements are provided.

14 Claims, 9 Drawing Sheets

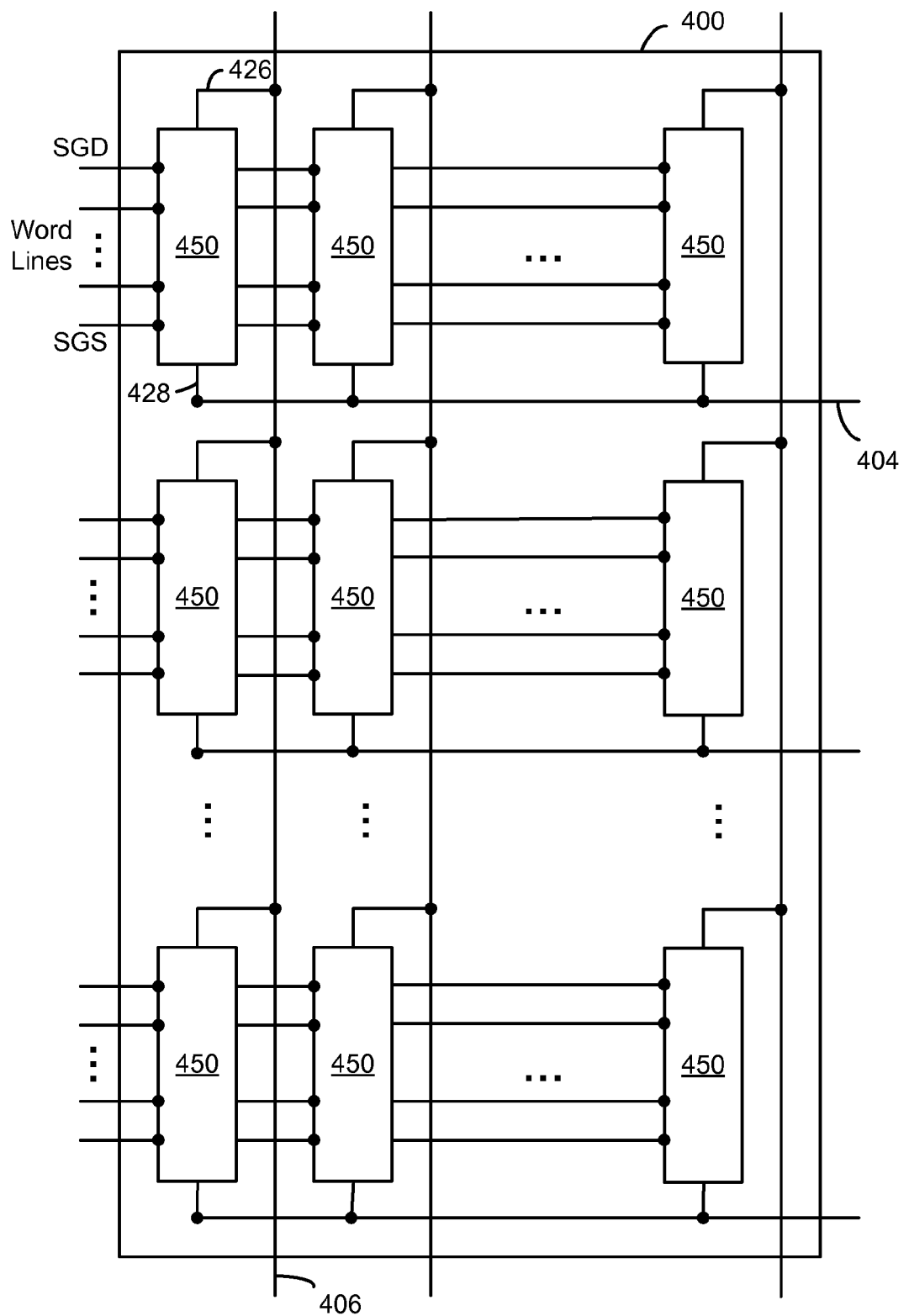

Fig. 10b
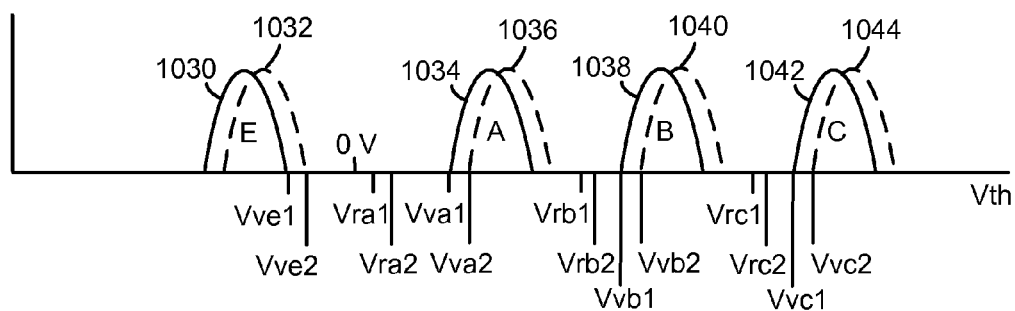
Fig. 10c
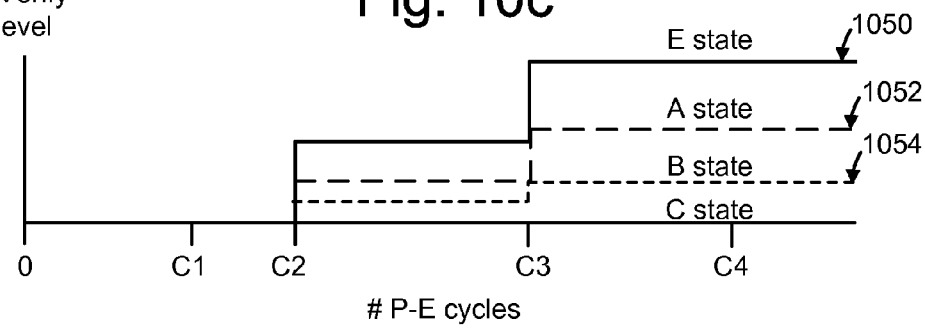
Fig. 10d
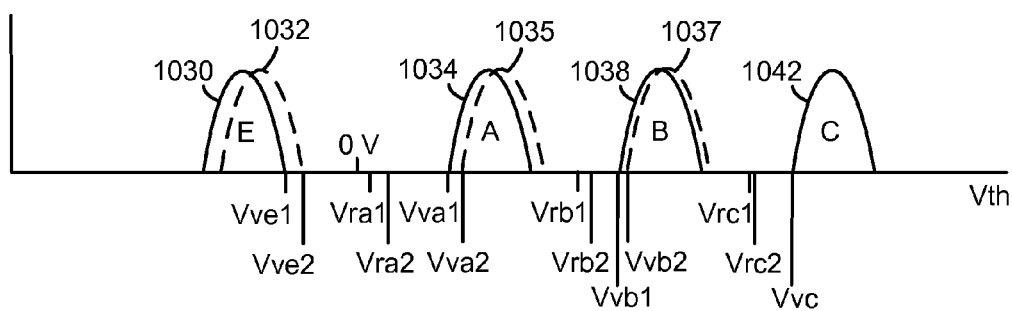

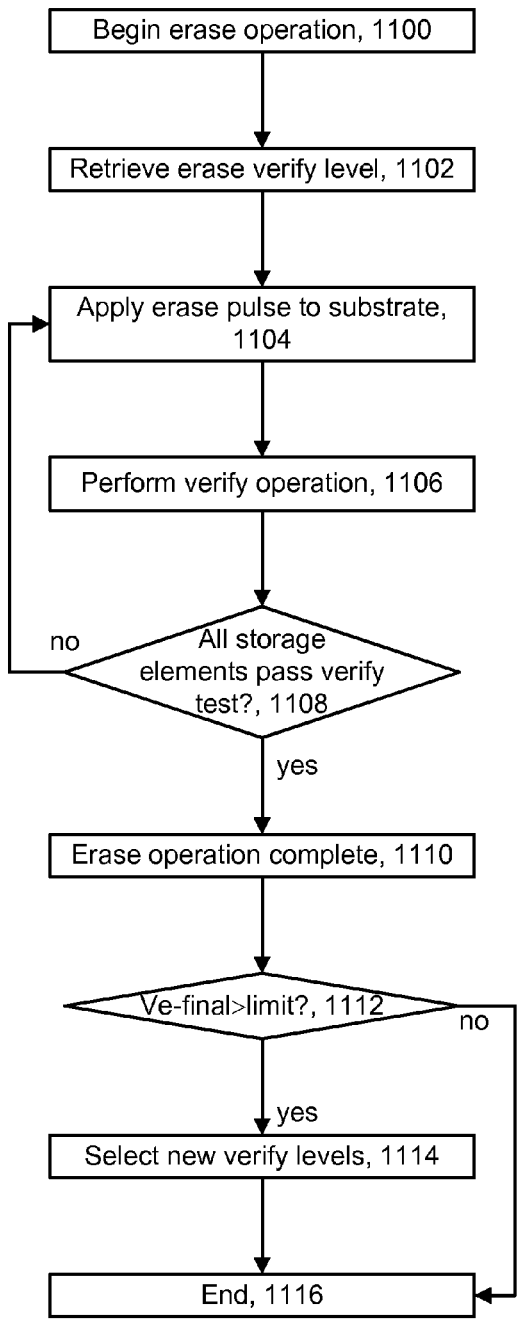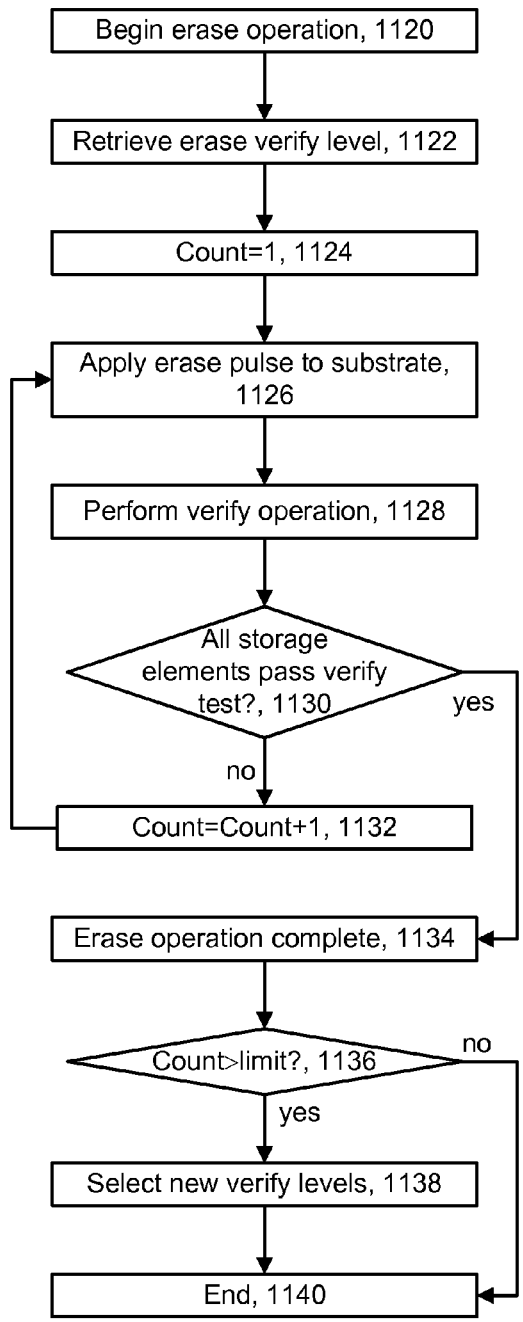

DYNAMICALLY ADJUSTABLE ERASE AND PROGRAM LEVELS FOR NON-VOLATILE MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, performance often degrades as a memory device experiences an increasing number of program-erase cycles.

BRIEF DESCRIPTION OF THE DRAWINGS

FIG. 4 is a block diagram of an array of NAND flash memory cells.

FIG. 10b depicts an example threshold voltage distribution of a set of storage elements which uses four data states, where verify levels are increased by equal increments for all data states.

FIG. 10c depicts an adjustment in a verify level with increasing program-erase cycles, as a function of data state.

FIG. 10d depicts an example threshold voltage distribution of a set of storage elements which uses four data states, where verify levels are increased by different increments for different data states.

FIG. 11a depicts an example erase process which tracks an erase pulse amplitude.

FIG. 11b depicts an example erase process which tracks a number of erase pulses.

DETAILED DESCRIPTION

A method and non-volatile storage system are provided in which degradation of storage elements is reduced by adaptively adjusting erase-verify levels and program-verify levels.

Storage elements gradually become more difficult to erase with increasing program-erase cycles due to factors such as charge trapping. As a result, the number of erase pulses required increases. This in turn increases the rate of degradation of the storage element, resulting in a vicious cycle. To reduce this problem, erase-verify levels and program-verify levels can be dynamically adjusted based on, e.g., the highest amplitude erase pulse or the number of erase pulses which are applied. When the amplitude or number reaches a limit, the erase-verify level is incrementally increased, so that the highest amplitude erase pulse or the number of required erase pulses decreases back to a nominal level since the erase operation can be completed more easily. Moreover, one or more program-verify levels can be adjusted in concert with adjustments to the erase-verify level. The one or more program-verify levels can increase by the same increment as the erase-verify level to maintain a constant threshold voltage window between the erased state and a programmed state, or by a different increment.

Figure 1A:
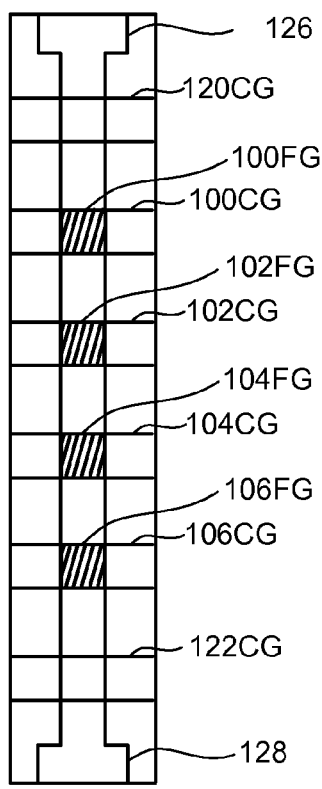
FIG. 1a is a top view of a NAND string.
Figure 1B:
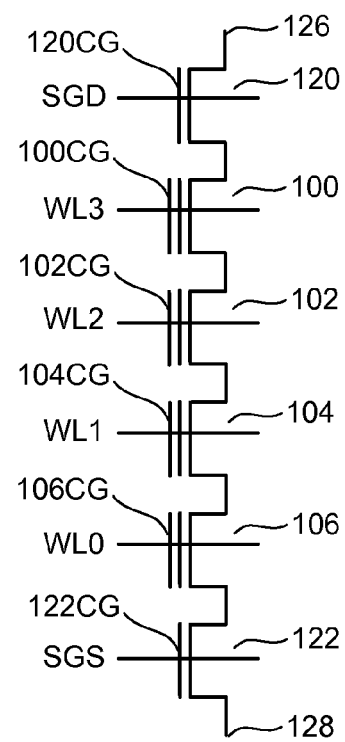
FIG. 1b is an equivalent circuit diagram of the NAND string.

One example of a suitable memory system uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
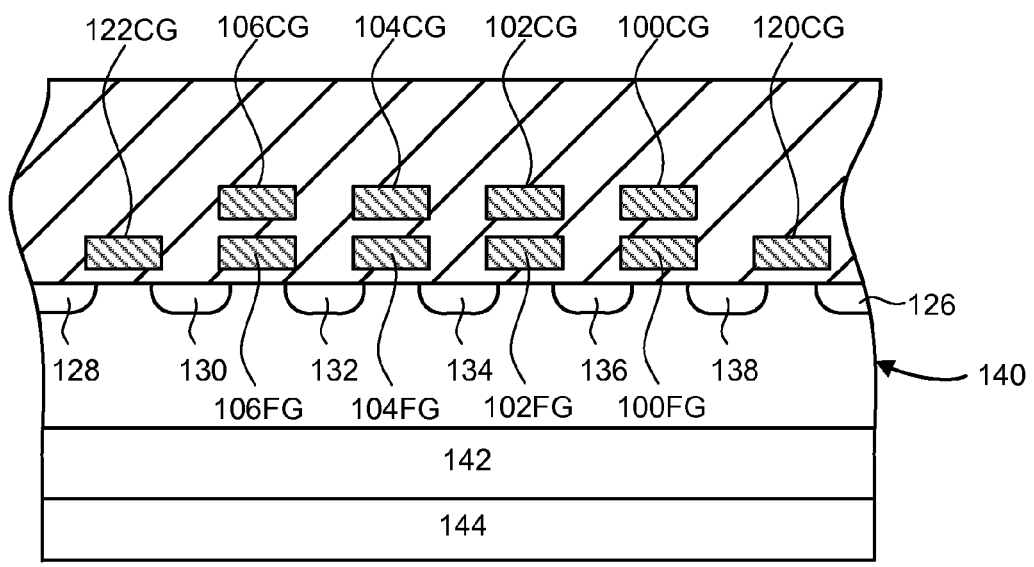
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a, 1b and 2 show four memory cells in the NAND string, a NAND string used with the technology described herein can have fewer than four memory cells or more than four memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
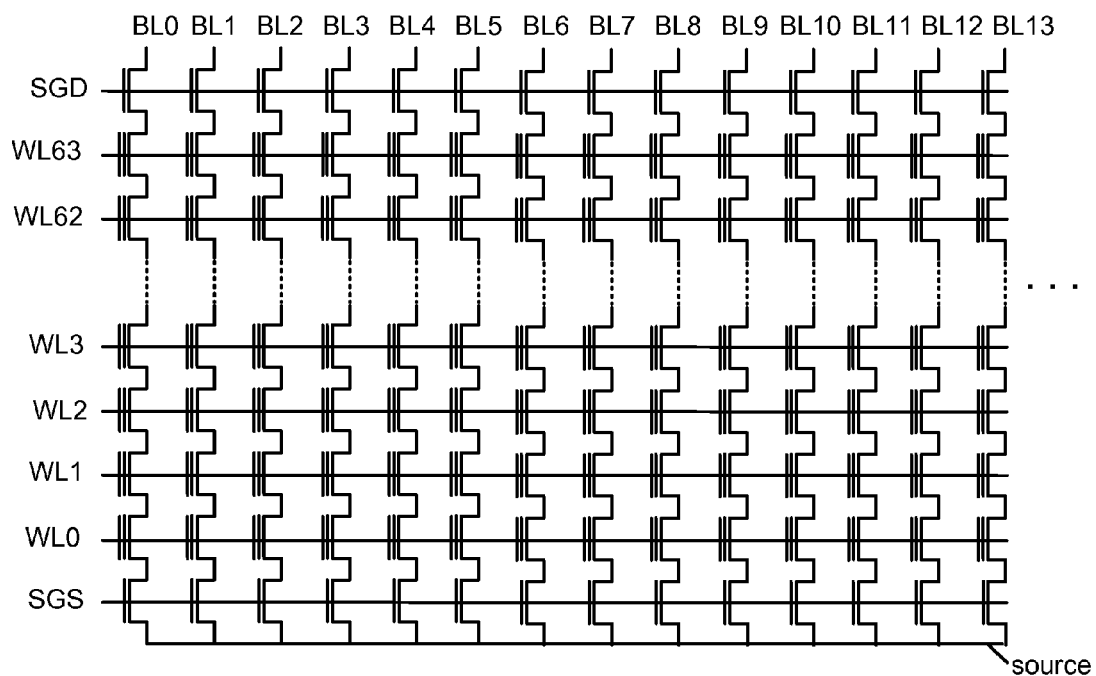
FIG. 3 depicts a block of NAND flash memory cells.

FIG. 3 depicts a block of NAND flash memory cells. The block includes a number of NAND strings and respective bit lines, e.g., BL0, BL1, . . . . Each NAND string is connected at one end to a drain select gate (SGD), and the control gates of the drain select gates are connected via a common SGD line. The NAND strings are connected at their other end to a source select gate which, in turn, is connected to a common source line. A number of word lines, e.g., WL0-WL63, when there are 64 word lines, extend between the source select gates and the drain select gates.

FIG. 4 illustrates an example of an array 400 of NAND cells, such as those shown in FIGS. 1a-2. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Figure 5B:
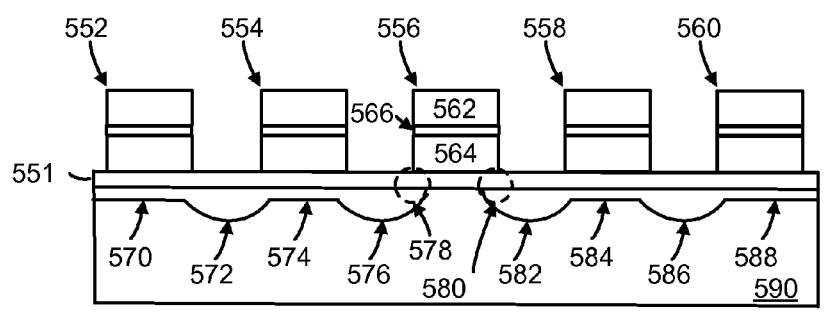
FIG. 5b depicts a cross-sectional view of a NAND string showing charge trapping at edges of a floating gate.
Figure 5A:
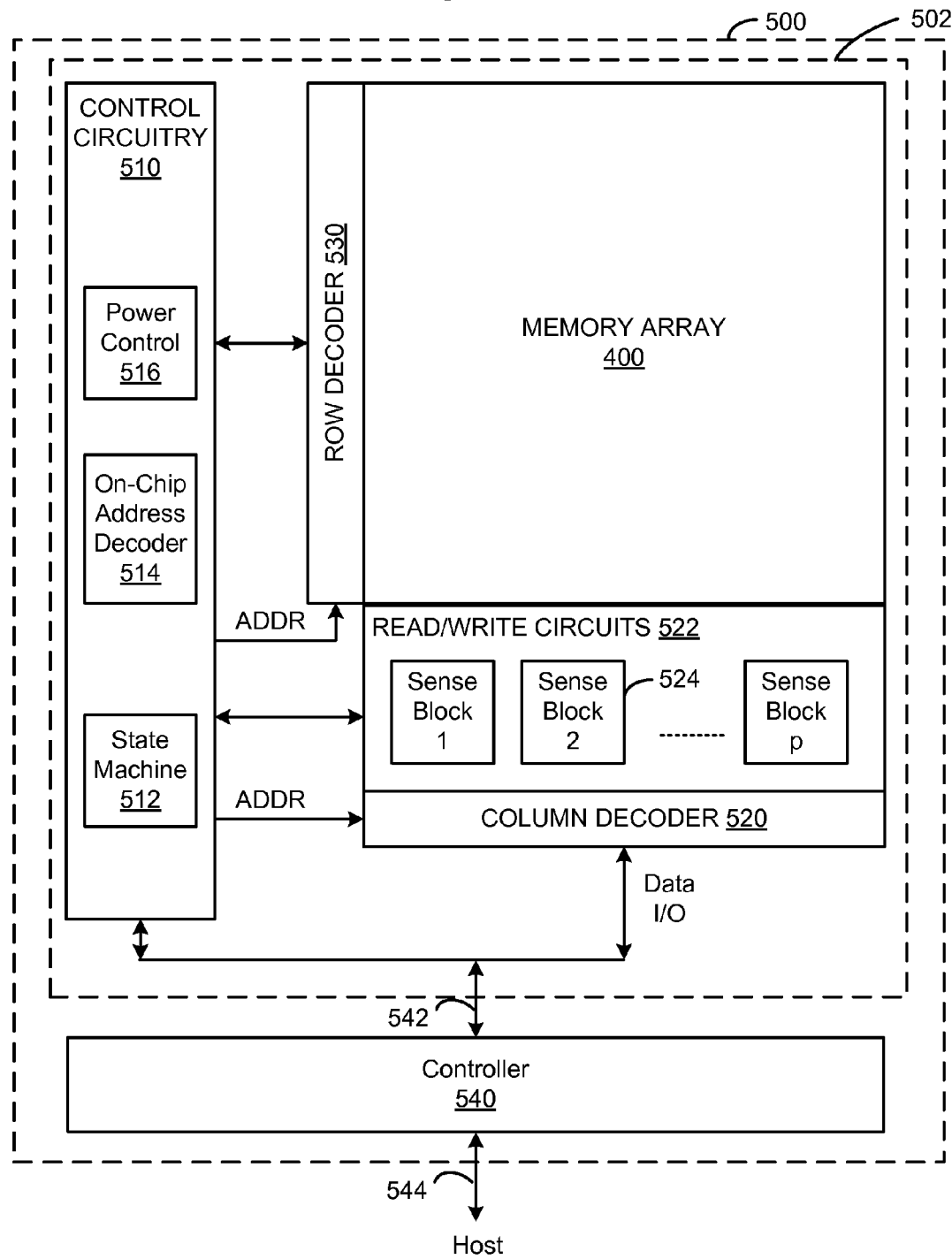
FIG. 5a is a block diagram of a non-volatile memory system.

FIG. 5a illustrates a memory device 500 having read/write circuits for reading and programming a page of memory cells in parallel, according to one embodiment. Memory device 500 may include one or more memory die 502. Memory die 502 includes a two-dimensional array of memory cells 400, control circuitry 510, and read/write circuits 522. The memory array 400 is addressable by word lines via a row decoder 530 and by bit lines via a column decoder 520. The read/write circuits 522 include multiple sense blocks 524 and allow a page of memory cells to be read or programmed in parallel. Typically, a controller 540 is included in the same memory device 500 (e.g., a removable storage card) as the one or more memory die 502. Commands and Data are transferred between the host and controller 540 via lines 544 and between the controller and the one or more memory die 502 via lines 542.

The control circuitry 510 cooperates with the read/write circuits 522 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 520. The power control module 516 controls the power and voltages supplied to the word lines and bit lines during memory operations.

In another approach, dual row/column decoders and read/write circuits are used. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

FIG. 5b depicts a cross-sectional view of a NAND string showing charge trapping at edges of a floating gate. The NAND string includes example storage elements 552, 554, 556, 558 and 560 formed on a gate oxide 551 on substrate 590. The selected storage element 556 is selected for programming or sensing. During sensing, for instance, the unselected storage elements 552, 554, 558 and 560 receive a read pass voltage, Vread, which is sufficiently high to form conductive channels 570, 574, 584 and 588, respectively. In this example, no channel is formed under the storage element 556.

Source/drain regions 572, 576, 582 and 586 are also depicted. Under the storage element 556, which includes a control gate 562, floating gate 564 and inter-poly dielectric (IPD) 566, charge trapping can occur in regions 578 and 580, near edges of the floating gate 564. Over multiple program-erase cycles which occur over time, the charge trapping results in electrons accumulating in the regions 578 and 580. The charge trapping can form parasitic cells between the floating gates which impact the threshold voltage of the storage element 556. This impact is seen as an increase in program noise and increased capacitive coupling with write-erase cycles.

This problem is seen with both multi-level storage elements, which store two or more bits of data in four of more data states, and binary storage elements, which store one bit of data in two data states. For instance, regarding binary storage elements, some memory device such as NAND memory devices may use strong ECC correction, where binary blocks are used as data cache blocks. Due to a relatively small number of such binary blocks in a memory device, the program-erase endurance requirement can be very high, e.g., 50,000 cycles or more. To meet such a high endurance requirement, it is important to minimize storage element degradation which occurs during program-erase cycles.

Figure 6A:
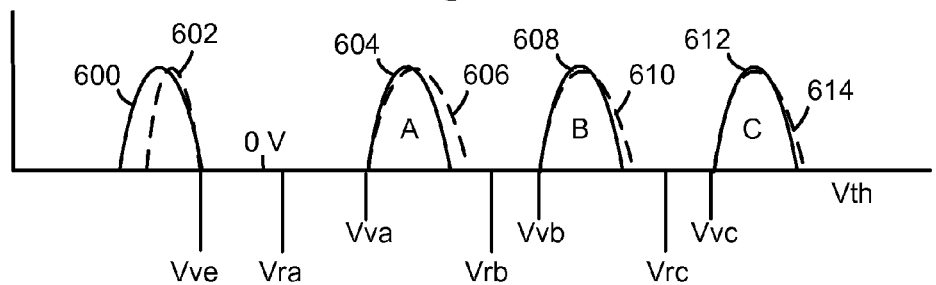
FIG. 6a depicts an example threshold voltage distribution of a set of storage elements which uses four data states.

FIG. 6a depicts an example threshold voltage distribution of a set of storage elements which uses four data states. The x-axis indicates a threshold voltage and the y-axis indicates a number of storage elements. The four data states are: an erased E state, an A state, a B state and a C state. A first threshold voltage distribution 600 is seen for E-state storage elements when there are relatively few program-erase cycles, while a second threshold voltage distribution 602 is seen for E state storage elements when there are relatively many program-erase cycles. During charge trapping which occurs over many program-erase cycles, the intrinsic threshold voltage of a storage element increases, which makes the storage element more difficult to erase.

During an erase operation, the storage elements are erased, in one possible approach, by applying erase voltage pulses to the p-well and grounding or applying a low bias on the word lines of a selected block while the source and bit lines are floating. Due to capacitive coupling, the unselected word lines, bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another set of storage elements.

In particular, one or more erase pulses are applied until all of the storage elements are verified to have a threshold voltage which is below Vve, an erase-verify level. Due to charge trapping which occurs over many program-erase cycles, the intrinsic threshold voltage of a storage element increases, which makes the storage element more difficult to erase. When the storage elements have relatively few program-erase cycles, the threshold voltage can overshoot below Vve, even with application of a single erase pulse, leading to the relatively wide threshold voltage distribution 600. A soft programming process is sometimes used as part of an erase operation to tighten the threshold voltage distribution by raising up the threshold voltage of storage elements for which there is significant overshoot. On the other hand, when the storage elements have relatively many program-erase cycles, the threshold voltage tends to overshoot less past Vve, leading to the relatively narrow voltage distribution 602.

Moreover, programming becomes easier with increasing program-erase cycles, so that overshoots to the positive side of the verify levels Vva, Vvb and Vvc are more likely, leading to widening of the threshold voltage distributions for the programmed states A, B and C. When programming storage elements to state A, B or C, the system will test whether those storage elements have a threshold voltage greater than or equal to Vva, Vvb or Vvc, respectively. Threshold voltage distributions 604 and 606 are seen for fresh and cycled A-state storage elements, respectively. Threshold voltage distributions 608 and 610 are seen for fresh and cycled B-state storage elements, respectively. Threshold voltage distributions 612 and 614 are seen for fresh and cycled C-state storage elements, respectively. In one embodiment, the threshold voltages in the E-state distribution are negative and the threshold voltages in the A, B and C distributions are positive.

Three read reference voltages, Vra, Vrb and Vrc, are also provided for reading data from storage elements. By testing whether the threshold voltage of a given storage element is above or below Vra, Vrb and Vrc, the system can determine the data state which is represented by the storage element.

Figure 6B:
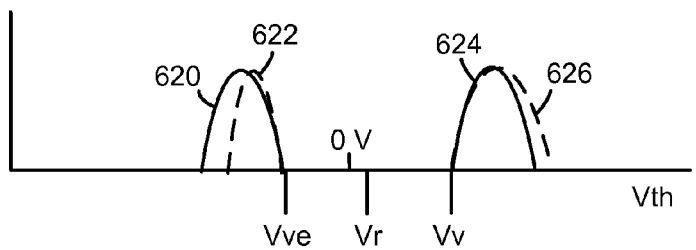
FIG. 6b depicts an example threshold voltage distribution of a set of storage elements which uses two data states.

FIG. 6b depicts an example threshold voltage distribution of a set of storage elements which uses two data states. A similar result as FIG. 6a is seen for binary storage elements. Threshold voltage distributions 620 and 622 are seen for fresh and cycled E-state storage elements, respectively, which are erased using a verify level Vve. Threshold voltage distributions 624 and 626 are seen for fresh and cycled programmed state storage elements, respectively, which are programmed using a verify level Vv. A read level Vr is also depicted.

Figure 7A:
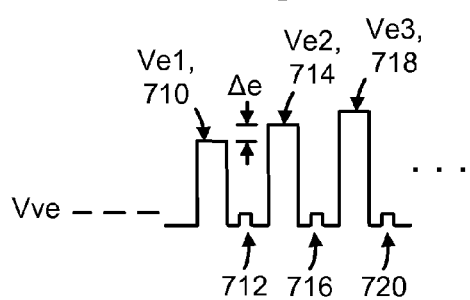
FIG. 7a depicts a voltage waveform used in an erase operation.

FIG. 7a depicts a voltage waveform used in an erase operation. As mentioned, an erase operation may involve applying a series of erase pulses to the p-well of a memory device. In this example, the erase pulses increase incrementally by a step size Δe. The erase can step up at a fixed or varying rate, for instance. The final erase pulse in the series which completes the erase operation has an amplitude which is referred to as Ve–final. It is also possible to use fixed-amplitude pulses. Each erase pulse can be followed by a verify pulse with an amplitude of Vve, the verify level. Here, a sequence includes example erase pulses 710, 714 and 718, with amplitudes Ve1, Ve2 and Ve3, respectively, and erase-verify pulses 712, 716 and 720.

Figure 7B:
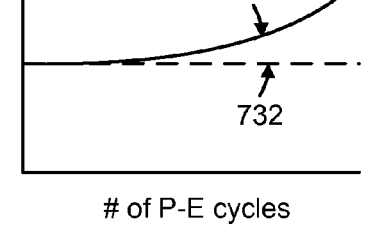
FIG. 7b depicts a change in erase performance with increasing program-erase cycles.

FIG. 7b depicts a change in erase performance with increasing program-erase cycles. The x-axis depicts a number of program-erase (P-E) cycles, and the y-axis depicts a final erase voltage (Ve–final) or a number of erase pulses applied in an erase operation. Curve 730 indicates that Ve–final or the number of erase pulses increases with the number of P-E cycles, typically slowly at first and at a faster rate later, as the storage elements become harder to erase. Line 732 represents an ideal which is sought. Storage element degradation is very sensitive to erase voltage, such that when an erase voltage of a certain amplitude is applied, the storage element degradation increases significantly. The faster degradation, in turn, results in the need for higher amplitude erase pulses or additional erase pulses during an erase operation, leading to a vicious cycle. A counteracting factor is that storage elements can be programmed with a somewhat lower final program voltage, with increasing P-E cycles, so that degradation due to program pulses is reduced. However, the increasing erase voltage is usually an overriding factor in driving degradation.

Figure 8A:
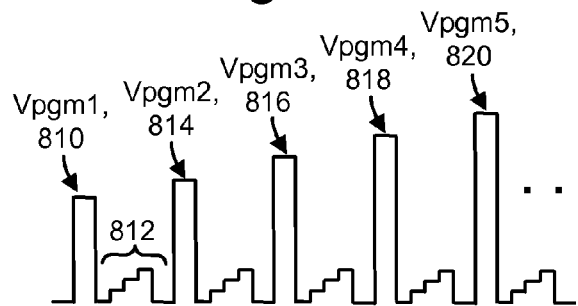
FIG. 8a depicts a voltage waveform applied to the control gates of storage elements during a program operation.

FIG. 8a depicts a voltage waveform applied to the control gates of storage elements during a program operation. The waveform or pulse train includes program pulses 810, 814, 816, 818 and 820 . . . which step up in amplitude by a step size, and a set of verify pulses between each program pulse, including example verify pulses 812, such as Vva, Vvb and Vvc, e.g., as discussed in connection with FIG. 6a. The program pulses can be fixed in amplitude, or they can step up at a fixed or varying rate, for instance.

In one embodiment, the programming pulses have a voltage which starts at an initial level such as 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses.

The waveform may be used during all bit line programming, for instance, or during even-odd programming. During all bit line programming, storage elements of even- and odd-numbered bit lines are programmed together, and verified together. During one type of even-odd programming, storage elements of even-numbered bit lines are programmed and verified using repeated applications of the waveform, followed by storage elements of odd-numbered bit lines being programmed and verified using repeated applications of the waveform. In another type of programming, storage elements of even- and odd-numbered bit lines are programmed together, but the verify operation is performed separately, e.g., first for the even-numbered bit lines and then for the odd-numbered bit lines.

Figure 8B:
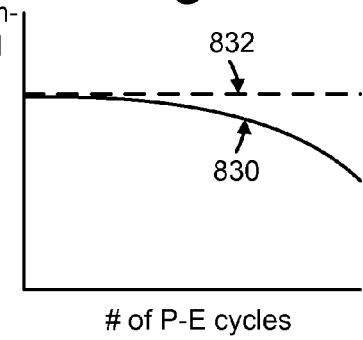
FIG. 8b depicts a change in program performance with increasing program-erase cycles.

FIG. 8b depicts a change in program performance with increasing program-erase cycles. The x-axis depicts a number of program-erase (P-E) cycles, and the y-axis depicts a final program voltage (Vpgm-final). Curve 830 indicates that Vpgm-final decreases with the number of P-E cycles, typically slowly at first and at a faster rate later, as the storage elements become easier to program. Line 832 represents an ideal which is sought.

Figure 9A:
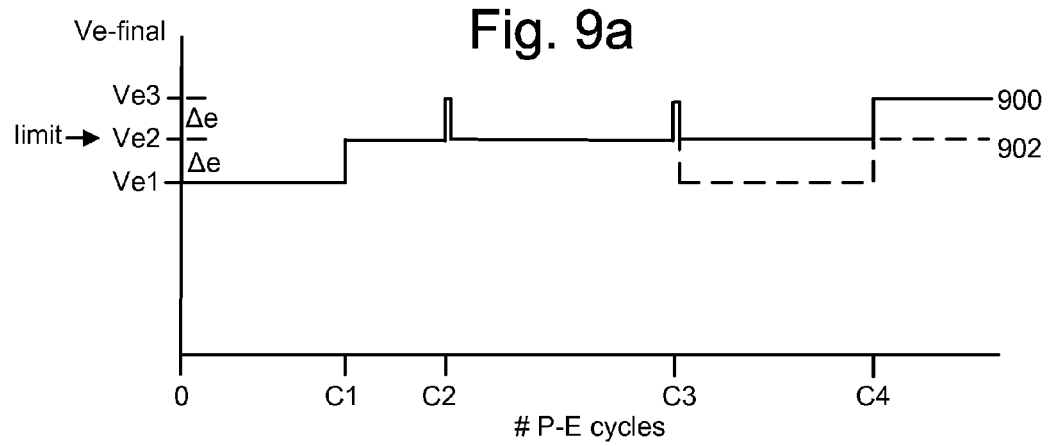
FIG. 9a depicts a periodic adjustment to an erase operation based on a final erase pulse amplitude.

FIG. 9a depicts a periodic adjustment to an erase operation based on a final erase pulse amplitude. A technique is provided for dynamically adjusting erase- and program-verify levels over the lifetime of a set of storage elements, to avoid an accelerated storage element degradation which is caused by increased erase pulse amplitudes. In one implementation, a controller of the memory device tracks a highest erase pulse amplitude and/or a number of erase pulses which are applied to the substrate of the set of non-volatile storage elements in erase operations which occur over a first portion of a lifetime of the set of non-volatile storage elements. The erase pulse number can be a proxy for the highest erase pulse amplitude. Each erase operation over the first portion of the lifetime uses a first value for an erase-verify level. Based on the tracking, a determination is made as to when a condition is met for adjusting the erase-verify level. Subsequently, over a second portion of the lifetime of the set of non-volatile storage elements, a second value is used for the erase-verify level in place of the first value in each erase operation. This procedure can be extended to additional erase-verify levels as well over subsequent portions of the lifetime.

On the x-axis, C1-C4 depict various P-E cycle values which are seen during the lifetime of a set of storage elements. Each interval of P-E cycles corresponds to a time period or portion of the lifetime. On the y-axis, the final erase pulse amplitude Ve-final is depicted, including Ve1-Ve3, consistent with FIG. 7a. The final erase pulse amplitude is the highest amplitude pulse used in an erase operation. For example, if Ve-final=Ve1, only one erase pulse is needed in the erase operation. If Ve-final=Ve2, two erase pulses are needed in the erase operation. If Ve-final=Ve3, three erase pulses are needed in the erase operation. The step size $\Delta e$ is also depicted.

As an illustration, initially, when the set of storage elements is fresh and has few P-E cycles (e.g., from 0-C1 cycles), Ve-final=Ve1, e.g., only one erase pulse is needed to complete an erase operation. At C1 cycles, some amount of degradation has accumulated so that Ve-final=Ve2, e.g., two erase pulses are needed to complete an erase operation. At C2 cycles, Ve-final=Ve3, so that three erase pulses are needed to complete an erase operation. However, in this example, Ve-final=Ve2 is set as a limit which cannot be exceeded. When the limit is exceeded, this triggers a corrective action, namely adjusting the erase-verify level Vve. The erase-verify level, assuming it is a negative value (Vve<0 V) can be increased so that it is less negative. In other words, the magnitude of Vve, |Vve|, is decreased. As a result, Ve-final can be returned or rolled back in subsequent erase operations to a lower level which was seen with fewer P-E cycles.

Specifically, just after C2 P-E cycles, Ve-final rolls back to Ve2 instead of Ve3. The amount that Ve-final decreases or rolls back after C2 depends on the amount that Vve increases, In one possible approach, the rollback corresponds to one erase pulse, so that Ve-final decreases by $\Delta e$. This can be achieved by raising Vve by $\Delta e$, the step size of the erase pulses. This situation continues between C2 and C3 with Ve-final=Ve2 until, again, additional degradation accumulates, so that Ve-final=Ve3 when C3 P-E cycles are reached. A further adjustment to Vve is triggered at this point, such as by increasing Vve again by $\Delta e$. Between C3 and C4, Ve-final rolls back to Ve2 (solid line 900).

The rollback in Ve-final when it reaches the limit can be larger or smaller for different P-E cycles. For example, Ve-final can be decreased by $2\times\Delta e$ at C3 by raising Vve by $2\times\Delta e$. This larger decrease ensures that Ve-final will not exceed the limit again for a greater number of P-E cycles than if a smaller decrease was used. In particular, Ve-final rolls back to Ve1 (dashed line 902) between C3 and C4.

At C4 P-E cycles, Ve-final (line 900) again increase to Ve3 so that the limit is exceeded. However, in this illustration, no further adjustment is made to Vve because a maximum allowable adjustment has been reached. Thus, only two adjustments to Vve are allowed as an example. In the example alternative approach, at C4 P-E cycles, Ve-final (line 902) increases to Ve2 so that the limit is not exceeded.

As a result of this technique, the erase pulse amplitude and number of erase pulses is kept within a limited range, instead of increasing unchecked, so that storage element degradation is reduced.

Again, this is one possible implementation, as many variations are possible. For example, the limit on the erase pulse amplitude or the number of erase pulses is fixed in this example. However, it can vary. For example, the limit can be allowed to increase with P-E cycles.

Also, the limit on the erase pulse amplitude or the number of erase pulses can be a fixed value for different sets of storage elements or it can be determined specifically for an individual set of storage elements, so that the limit can differ for different sets of storage elements. For example, a set of storage elements can be monitored when it has few P-E cycles to determine a baseline Ve-final, and the limit for Ve-final can be set as a function of this baseline by adding some increment to the baseline. For instance, a first set of storage elements may have Ve-final=Ve2 initially, in which case the limit may be set as Ve4, for instance. A second set of storage elements may have Ve-final=Ve1 initially, in which case the limit may be set as Ve3, for instance. Similarly, a set of storage elements can be monitored when it has few P-E cycles to determine a baseline number of erase pulses, and the limit for the number of erase pulses can be set as a function of this baseline by adding some increment to the baseline. For instance, a first set of storage elements may have erase pulse count=1, in which case the limit may be set as count=3, for instance. A second set of storage elements may have erase pulse count=2, in which case the limit may be set as count=4, for instance.

In addition to adjusting the erase-verify level, one or more program-verify levels can be adjusted as well, as discussed further below.

Note that in the case of binary storage elements, such as in a binary cache, the binary storage elements are typically provided in different blocks which tend to be used relatively uniformly because the total number of binary cache blocks is relatively small. For example, if one block of binary storage elements has experienced 1,000 P-E cycles, the other blocks of binary storage elements will likely have experienced about 1,000 P-E cycles. In this case, it is sufficient for a controller of the memory device to track one block or a few blocks, for instance, and then apply the adjustment in Vve concurrently to all of the blocks or to some multiple of the blocks of binary storage elements.

On the other hand, blocks of multi-level (e.g., four or more level) storage elements often experience significantly different levels of P-E cycling, at a given point in time, e.g., due to the unpredictable nature of read and write operations for these blocks. Some blocks may be used substantially more or less than other blocks. In this case, one possibility is to have the controller track the number of P-E cycles experienced by each block individually and provide an optimum adjustment to erase- and program-verify levels for each block.

Generally, an erase operation can erase one block at a time, and be configured with erase-verify level and program-verify levels for each block. When the controller operates on a particular block, it uses the corresponding verify levels.

Figure 9B:
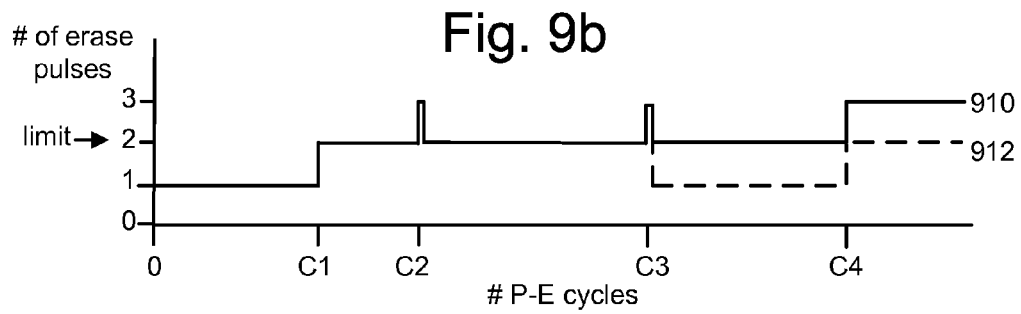
FIG. 9b depicts a periodic adjustment to an erase operation based on a number of erase pulses.

FIG. 9b depicts a periodic adjustment to an erase operation based on a number of erase pulses. The x-axes of FIGS. 9a and 9b are consistent. As mentioned, the number of erase pulses can be tracked in place of the final erase pulse amplitude as a metric of degradation. In this example, erase pulses 1, 2 and 3 correspond to pulse amplitudes Ve1, Ve2 and Ve3, respectively. At C1 P-E cycles, the number of erase pulses increases from one to two, which is at the limit, but not exceeding the limit. At C2, the number of erase pulses increases from two to three, which exceeds the limit, triggering an increase in Vve. Between C2 and C3, the number of erase pulses is two. At C3, the number of erase pulses again exceeds the limit, triggering another increase in Vve.

The solid line 910 corresponds to the scenario where Vve is increase by $\Delta e$, and the dashed line 912 corresponds to the scenario where Vve is increased by $2\times\Delta e$. The number of erase pulses again exceeds the limit at C4 (line 910), but no further adjustment to Vve is made. Alternatively, the number of erase pulses increases from one to two at C4 (line 912).

Figure 9C:
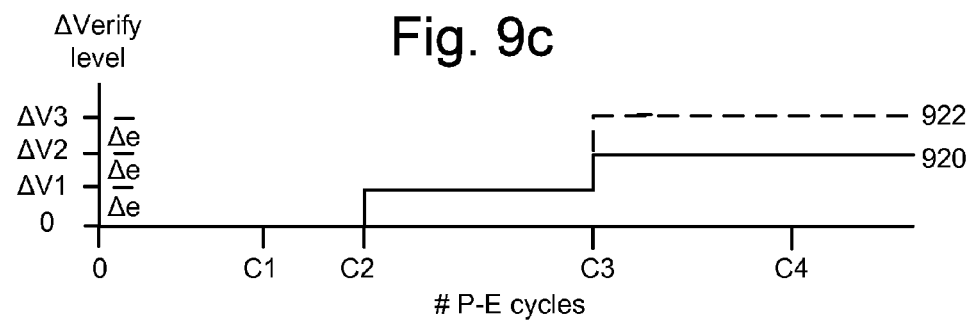
FIG. 9c depicts an adjustment in a verify level with increasing program-erase cycles.

FIG. 9c depicts an adjustment in a verify level ($\Delta$Verify level) with increasing program-erase cycles (# P-E cycles). The verify level is an erase-verify level and can also represent a program-verify level. The x-axes of FIGS. 9a-9c are consistent. In the examples of FIGS. 9a and 9b, adjustments to verify levels are made at C2 and C3 P-E cycles, when the final erase pulse amplitude or number of erase pulses exceed a limit. Between 0 and C2 P-E cycles, no adjustment is implemented. Between C2 and C3 P-E cycles, a total adjustment of $\Delta V1$ is implemented. After C3 P-E cycles, a total adjustment of $\Delta V2$ (line 920) or $\Delta V3$ (line 922) is implemented. Line 920 indicates that a fixed adjustment to the verify level is applied each time an adjustment is made, regardless of the number of P-E cycles. Dashed line 922 indicates that a larger adjustment is made to the verify level when the number of P-E cycles is higher. Thus, the adjustment to the verify level can vary as function of the number of P-E cycles.

In one possible approach, 0 V, $\Delta V1$, $\Delta V2$ and $\Delta V3$ are equally spaced apart by $\Delta e$, the step size of the erase pulses (see FIG. 7a). This approach is appropriate since the shift in threshold voltage of a storage element during the erase operation, with each erase pulse, is approximately equal to $\Delta e$ in some situations.

Figure 10A:
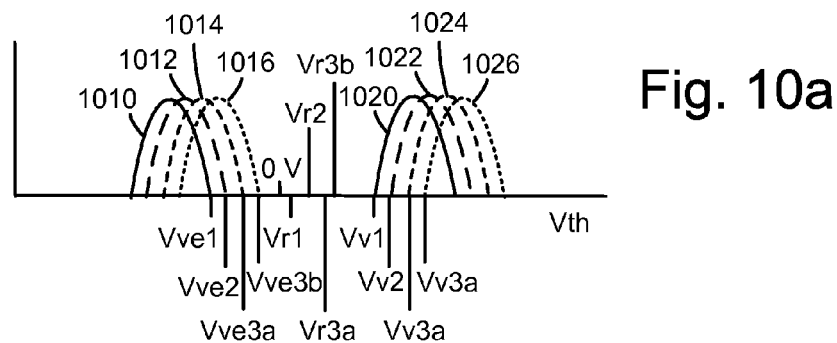
FIG. 10a depicts an example threshold voltage distribution of a set of storage elements which uses two data states, with four different sets of verify levels.

FIG. 10a depicts an example threshold voltage distribution of a set of storage elements which uses two data states, with four different sets of verify levels. In a binary distribution, the erase state may represent one bit value such as bit=0 while the programmed state represents the other bit value such as bit=1. Initially, when the number of P-E cycles is low, an initial set of verify voltages is used, including a first erase-verify voltage, Vve1, and a first program-verify voltage, Vv1. In this case, the resulting erase state threshold voltage distribution is distribution 1010, and the resulting programmed state threshold voltage distribution is distribution 1020. A corresponding read level is Vr1. Referring to FIGS. 9a-9c, a second, adjusted set of verify voltages is used at C2 P-E cycles, including Vve2 for the erased state and Vv2 for the programmed state. A corresponding read level is Vr2. Vve2 results in the erase distribution 1012, and Vv2 results in the programmed distribution 1022.

A third, adjusted set of verify voltages is used at C3 P-E cycles, including, in one option that corresponds to line 920 of FIG. 9c, Vve3a for the erased state and Vv3a for the programmed state. A corresponding read level is Vr3a. Vve3a results in the erase distribution 1014, and Vv3a results in the programmed distribution 1024.

Another option for the third, adjusted set of verify voltages corresponds to line 922 of FIG. 9c, where Vve3b is used for the erased state, Vv3b is used for the programmed state and a corresponding read level is Vr3b. Vve3b results in the erase distribution 1016, and Vv3b results in the programmed distribution 1026.

The read level can be set as the midpoint between the verify levels of the erase and programmed state, in one approach.

Generally, the threshold voltage difference or window between the verify levels of the erased state and the programmed state can be kept constant by raising the verify level of the programmed state by the same amount as the verify level of the erase state, e.g., by $\Delta V1$, $\Delta V2$ or $\Delta V3$. Thus, in one possible approach, Vv1−Vve1=Vv2−Vve2=Vv3a−Vve3a=Vv3b−Vve3b=constant.

Practically, there is a limit to how high the verify levels can be raised. For example, the erase-verify level usually remains below 0 V. In a programmed storage element, the verify level is limited by the amount of charge which can be stored, which in turn is limited by the physical dimensions of the storage element. Additionally, the increment by which the verify levels is raised is a design choice. Fewer increments results in decreased complexity. One possible approach uses three or four increments of 0.5 V each. For a binary storage element, a greater range of adjustment to the verify level may be tolerated. For example, a range of 2.0 V (with four 0.5 V adjustments) may be tolerated. For, a multi-level storage element, a sufficient spacing needs to be maintained between each state, so that a lesser range of adjustment, such as 1.5 V (with three 0.5 V adjustments) may be used.

FIG. 10b depicts an example threshold voltage distribution of a set of storage elements which uses four data states, where verify levels are increased by equal increments for all data states. As mentioned, for a multi-level storage element, a sufficient spacing needs to be maintained between each state. As an example, four states are depicted: states E, A, B and C. Initial verify levels which are used when the P-E cycles are low are Vve1, resulting in the initial erased distribution 1030, Vva1, resulting in the initial A-state distribution 1034, Vvb1, resulting in the initial B-state distribution 1038, and Vvc1, resulting in the initial C-state distribution 1042. Read levels in this case are Vra1, Vrb1 and Vrc1.

When the P-E cycles are higher, such as at the level C2 in FIG. 9b, all verify levels can be increased by a constant increment, in one possible approach, such as by $\Delta V1$. The adjusted verify levels are: Vve2, resulting in the adjusted erased distribution 1032, Vva2, resulting in the adjusted A-state distribution 1036, Vvb2, resulting in the adjusted B-state distribution 1040, and Vvc2, resulting in the adjusted C-state distribution 1044. Read levels in this case are Vra2, Vrb2 and Vrc2. Thus, Vve2−Vve1=Vva2−Vva1=Vvb2−Vvb1=Vvc2−Vvc1=$\Delta V1$=constant. Additional adjustments (not shown) to the verify levels can be implemented with increasing P-E cycles which result in corresponding adjusted threshold voltage distributions.

FIG. 10c depicts an adjustment in a verify level with increasing program-erase cycles, as a function of data state. As an alternative to the approach of FIG. 10b, verify levels can be adjusted differently for different data states. FIGS. 9c and 10c do not necessarily have the same y-axis scale, but the x-axes are consistent. Lines 1050, 1052 and 1054 represent an adjustment ($\Delta$Verify level) for E-state, A-state and B-state storage elements, respectively. No adjustment is made for C-state storage elements in this example. See also FIG. 10d. This approach may be used, for example, when it is be determined that the highest state's verify level cannot be increased. In this case, the verify levels of the programmed states are adjusted to allow the erase-verify level to increase without increasing the highest state's verify level. However, the example could be extended to provide an adjustment to the C state or other higher state as well.

When there are more than four states, separate adjustments can be provided for individual states, or multiple states can be group and provided with the same adjustment. For example with eight states E, A, B, C, D, E, F and G, separate adjustments can be provided for: state E, states A and B, states C and D, and states E and F, with no adjustment for state G, for instance. Another option is to make adjustments for: state E, states A, B and C, and states D, E and F, with no adjustment for state G, for instance. Many variations are possible. Testing can reveal optimal adjustment levels and optimal selection of groups of states to apply equal verify level adjustments.

Even in the case of four states, multiple states can be group and provided with the same adjustment. For example, states A and B can be grouped.

FIG. 10d depicts an example threshold voltage distribution of a set of storage elements which uses four data states, where verify levels are increased by different increments for different data states. The example is consistent with FIG. 10c. Here, the initial distributions 1030, 1034, 1038 and 1042 are the same as in FIG. 10b and the adjusted distribution 1032 is the same as in FIG. 10b. However, the A state, represented by adjusted distribution 1035, receives a smaller adjustment in FIG. 10d than the A state in FIG. 10b. The B state, represented by adjusted distribution 1037, also receives a smaller adjustment in FIG. 10d than the B state in FIG. 10b. The B state (1037) also receives a smaller adjustment than the A state (1035). The C state, represented by distribution 1042, receives no adjustment. The values of Vva2, Vvb2, Vra2, Vrb2 and Vrc2 are thus different in FIG. 10d versus FIG. 10b.

FIG. 11a depicts an example erase process which tracks an erase pulse amplitude. An erase operation begins at step 1100. An erase-verify level is retrieved by the controller from a storage location at step 1102. An erase pulse is applied to the substrate at step 1104. A verify operation is performed using the retrieved erase-verify level at step 1106. At decision step 1108, if all storage elements have not passed the verify test, another erase pulse is applied at step 1104. If decision step 1108 is true, the erase operation is complete, at step 1110. Decision step 1112 determines if Ve–final, the highest amplitude erase pulse used in the erase operation, exceeds the limit. If it does, new verify levels are selected at step 1114, and the process ends at step 1116. Step 1114 can select new erase-verify and program-verify levels. In practice, a number of sets of erase-verify and program-verify levels can be stored in memory, and a particular one of the sets can be accessed at a time during erase and program operations for use during a portion of the lifetime of the set of storage elements.

FIG. 11b depicts an example erase process which tracks a number of erase pulses. An erase operation begins at step 1120. An erase-verify level is retrieved by the controller from a storage location at step 1122. A count of erase pulses is set to one at step 1124. An erase pulse is applied to the substrate at step 1126. A verify operation is performed using the retrieved erase-verify level at step 1128. At decision step 1130, if all storage elements have not passed the verify test, the count is incremented at step 1132, and another erase pulse is applied at step 1264. If decision step 1130 is true, the erase operation is complete, at step 1134. Decision step 1136 determines if the count exceeds a limit. If it does, new verify levels are selected at step 1138, and the process ends at step 1140. Step 1138 can select new erase-verify and program-verify levels.

Generally, e.g., in FIGS. 11a and 11b, the triggering of an adjustment can be based on different criteria. In one approach, an adjustment is triggered when the limit is exceeded in a single erase operation. In another approach, the adjustment is triggered when the limit is exceeded in a number of successive erase operations, e.g., the last N erase operations, or non-successive erase operations, e.g., the last N1 out of N2 erase operations. In another approach, a moving average of Ve–final or the number of erase pulses for the last N erase operations is calculated after each erase operation, and the adjustment is triggered when the limit is exceed by the moving average.

Figure 12A:
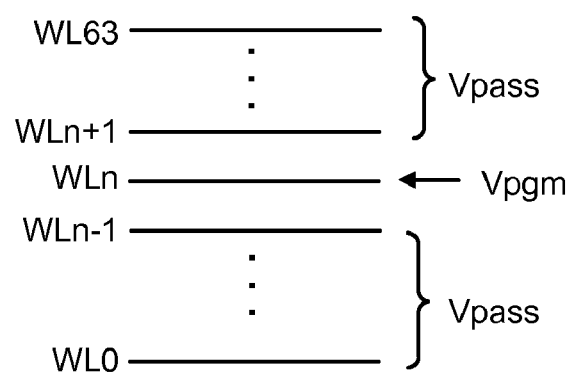
FIG. 12a depicts a set of pass voltages applied to unselected word lines during a program operation.

FIG. 12a depicts a set of pass voltages applied to unselected word lines during programming. A number of word lines in a block, e.g., 64 word lines, extending from WL0 at a source side of the block to WL63 at a drain side of the block, are depicted as an example. WLn represents a selected word line, e.g., a word line which is in communication with storage elements which are to be programmed in a program operation. During programming, when Vpgm is applied to WLn, pass voltages can be applied to the unselected word lines. For simplicity, the same pass voltage is indicated as being applied to all unselected word lines WL0 to WLn−1 and WLn+1 to WL63. However, various schemes exist for applying different pass voltages to different word lines. For example, zero or near zero Volt isolation voltages can be applied to one or more of the unselected word lines.

Figure 12B:
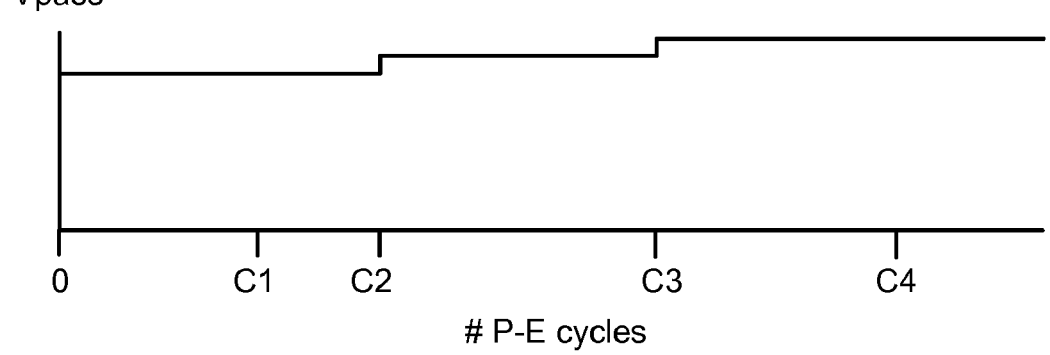
FIG. 12b depicts a pass voltage as a function of increasing program-erase cycles.

Due to the adjustment of the program-verify levels using the techniques described herein, it can be desirable to also adjust the pass voltages. For example, as the one or more program-verify levels are adjusted higher over time and P-E cycles, such as at C2 and C3 P-E cycles, the pass voltage can also be increased, as depicted in FIG. 12b. FIG. 12b depicts a pass voltage as a function of increasing program-erase cycles. The x-axis is consistent with FIGS. 9a-c and 10c. When different pass voltages are used on different word lines, they can be adjusted by different amounts or by the same amount. The pass voltage can increase by an amount which is based on a difference between the increase program-verify level and the prior program-verify level. For example, an increase in the program-verify level of 0.5 V can result in an increase in the pass voltage of 0.5V, or more or less than 0.5 V, according to a ratio R. Generally, a different set of pass voltages can be used for each different set of program-verify voltages.

In one embodiment of the technology described herein, a method for operating non-volatile storage includes applying voltage pulses to a substrate of a set of non-volatile storage elements in each erase operation of multiple erase operations over a first portion of a lifetime of the set of non-volatile storage elements, where each erase operation over the first portion of the lifetime uses a first value for an erase-verify level. Based on the applying, the method further includes determining when a condition is met for adjusting the erase-verify level. When the condition is met for adjusting the erase-verify level, the method further includes using a second value for the erase-verify level in place of the first value in each erase operation of multiple erase operations over a second portion of the lifetime.

In another embodiment, a non-volatile storage system includes a set of storage elements on a substrate, and at least one control circuit in communication with the set of storage elements and the substrate. The at least one control circuit applies voltage pulses to the substrate in each erase operation of multiple erase operations over a first portion of a lifetime of the set of non-volatile storage elements, where each erase operation over the first portion of the lifetime uses a first value for an erase-verify level. Moreover, the at least one control circuit determines, based on the applied voltage pulses, when a condition is met for adjusting the erase-verify level, and when the condition is met for adjusting the erase-verify level, the at least one control circuit uses a second value for the erase-verify level in place of the first value in each erase operation of multiple erase operations over a second portion of the lifetime.

In another embodiment, a method for operating a non-volatile storage system includes applying voltage pulses to a substrate of a set of non-volatile storage elements in at least one erase operation of the set of non-volatile storage elements, where the voltage pulses are applied to the substrate until threshold voltages of the non-volatile storage elements move below a first erase-verify level. The method further includes subsequently programming at least one non-volatile storage element in the set of non-volatile storage elements to represent a data state by applying program pulses to the at least one non-volatile storage element until a threshold voltage of the at least one non-volatile storage element exceeds a first program-verify level. The method further includes subsequently performing at least one additional erase operation by applying voltage pulses to the substrate until threshold voltages of the non-volatile storage elements move below a second erase-verify level which exceeds the first erase-verify level.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for operating a non-volatile storage system, comprising:
    applying voltage pulses to a substrate of a set of non-volatile storage elements in each erase operation of a plurality of erase operations over a first portion of a lifetime of the set of non-volatile storage elements, each erase operation over the first portion of the lifetime uses a first value for an erase-verify level;
    based on the applying, determining when a condition is met for adjusting the erase-verify level, the condition is met when an amplitude of voltage pulses which are applied in at least one of the erase operations over the first portion of the lifetime exceeds a limit; and
    when the condition is met for adjusting the erase-verify level, using a second value, higher than the first value, for the erase-verify level in place of the first value in each erase operation of a plurality of erase operations over a second portion of the lifetime;
    the set of non-volatile storage elements include multi-level storage elements which are programmed to at least first, second and third programmed states using respective program-verify levels; and
    in the second portion of the lifetime: at least two of the respective program-verify levels are incremented, by different amounts, relative to the first portion of the lifetime.

2. The method of claim 1, wherein:
    the condition is met when a number of voltage pulses which are applied in at least one of the erase operations over the first portion of the lifetime exceeds a limit.

3. The method of claim 1, wherein:
    a difference between the first and second values is equal to a step size of the voltage pulses.

4. The method of claim 1, wherein the set of non-volatile storage elements is in communication with a set of word lines, the method further comprising:
    applying a first pass voltage to one or more unselected word lines in the set of word lines in an associated programming operation which occurs after each erase operation of the plurality of erase operations over the first portion of the lifetime; and
    applying a second pass voltage, higher than the first pass voltage, to the one or more unselected word lines in the set of word lines in place of the first pass voltage in an associated programming operation which occurs after each erase operation of the plurality of erase operations over the second portion of the lifetime.

5. The method of claim 1, wherein:
    in the second portion of the lifetime: each of the respective program-verify levels is incremented by a different amount, relative to the first portion of the lifetime.

6. The method of claim 1, wherein:
    in the second portion of the lifetime: at least two of the respective program-verify levels are grouped and incremented by one amount, and at least two others of the respective program-verify levels are grouped and incremented by another amount.

7. A non-volatile storage system which performs the method of claim 1.

8. A non-volatile storage system, comprising:
    a set of storage elements on a substrate; and
    at least one control circuit in communication with the set of storage elements and the substrate, the at least one control circuit applies voltage pulses to the substrate in each erase operation of a plurality of erase operations over a first portion of a lifetime of the set of non-volatile storage elements, each erase operation over the first portion of the lifetime uses a first value for an erase-verify level, the at least one control circuit determines, based on the applied voltage pulses, when a condition is met for adjusting the erase-verify level, the condition is met when an amplitude of voltage pulses which are applied in at least one of the erase operations over the first portion of the lifetime exceeds a limit, and when the condition is met for adjusting the erase-verify level, the at least one control circuit uses a second value for the erase-verify level in place of the first value in each erase operation of a plurality of erase operations over a second portion of the lifetime, a difference between the first and second values is equal to a step size of the voltage pulses.

9. The non-volatile storage system of claim 8, wherein:
    the condition is met when a number of voltage pulses which are applied in at least one of the erase operations over the first portion of the lifetime exceeds a limit.

10. A method for operating a non-volatile storage system, comprising:
    applying voltage pulses to a substrate of a set of non-volatile storage elements in at least one erase operation of the set of non-volatile storage elements, the voltage pulses are applied to the substrate until threshold voltages of the non-volatile storage elements move below a first erase-verify level, the set of non-volatile storage elements is in communication with a set of word lines;
    subsequently programming at least one non-volatile storage element in the set of non-volatile storage elements to represent a data state by applying program pulses to the at least one non-volatile storage element until a threshold voltage of the at least one non-volatile storage element exceeds a first program-verify level;

applying a first pass voltage to unselected word lines in the set of word lines during the programming which uses the first program-verify level;

subsequently performing at least one additional erase operation by applying voltage pulses to the substrate until threshold voltages of the non-volatile storage elements move below a second erase-verify level which exceeds the first erase-verify level;

subsequently programming the at least one non-volatile storage element to represent the data state by applying additional program pulses to the at least one non-volatile storage element until the threshold voltage of the at least one non-volatile storage element exceeds a second program-verify level which exceeds the first program-verify level; and applying a second pass voltage to unselected word lines in the set of word lines during the programming which uses the second program-verify level, the second pass voltage exceeds the first pass voltage by an amount which is based on a difference between the second program-verify level and the first program-verify level.

11. The method of claim 10, wherein:
the voltage pulses applied in the at least one erase operation and the at least one additional erase operation increase by a step size; and
the second erase-verify level exceeds the first erase-verify level by the step size.

12. A method for operating a non-volatile storage system, comprising:
applying voltage pulses to a substrate of a set of non-volatile storage elements in each erase operation of a plurality of erase operations over a first portion of a lifetime of the set of non-volatile storage elements, each erase operation over the first portion of the lifetime uses a first value for an erase-verify level;
based on the applying, determining when a condition is met for adjusting the erase-verify level; and
when the condition is met for adjusting the erase-verify level, using a second value, higher than the first value, for the erase-verify level in place of the first value in each erase operation of a plurality of erase operations over a second portion of the lifetime;
the set of non-volatile storage elements include multi-level storage elements which are programmed to at least first, second and third programmed states using respective program-verify levels;
in the second portion of the lifetime: at least two of the respective program-verify levels are incremented, by different amounts, relative to the first portion of the lifetime, and at least one of the respective program-verify levels is incremented by an amount which is equal to a difference between the first and second values of the erase-verify level.

13. A method for operating a non-volatile storage system, comprising:
applying voltage pulses to a substrate of a set of non-volatile storage elements in each erase operation of a plurality of erase operations over a first portion of a lifetime of the set of non-volatile storage elements, each erase operation over the first portion of the lifetime uses a first value for an erase-verify level;
based on the applying, determining when a condition is met for adjusting the erase-verify level; and
when the condition is met for adjusting the erase-verify level, using a second value, higher than the first value, for the erase-verify level in place of the first value in each erase operation of a plurality of erase operations over a second portion of the lifetime;
the set of non-volatile storage elements include multi-level storage elements which are programmed to at least first, second and third programmed states using respective program-verify levels;
in the second portion of the lifetime: at least two of the respective program-verify levels are incremented, by different amounts, relative to the first portion of the lifetime, and a highest program-verify level of the respective program-verify levels is not incremented.

14. The method of claim 13, wherein:
in the second portion of the lifetime: the respective program-verify level of the first programmed state is greater than, and is incremented by a greater amount than, the respective program-verify level of the second programmed state.

* * * * *